US010031411B2

(12) United States Patent
Shih et al.

(10) Patent No.: US 10,031,411 B2
(45) Date of Patent: Jul. 24, 2018

(54) PELLICLE FOR EUV MASK AND FABRICATION THEREOF

(71) Applicant: TAIWAN SEMICONDUCTOR MANUFACTURING COMPANY, LTD., Hsin-Chu (TW)

(72) Inventors: Chih-Tsung Shih, Hsinchu (TW); Shinn-Sheng Yu, Hsinchu (TW); Jeng-Horng Chen, Hsin-Chu (TW); Anthony Yen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/799,616

(22) Filed: Jul. 15, 2015

(65) Prior Publication Data

US 2016/0147137 A1     May 26, 2016

Related U.S. Application Data

(60) Provisional application No. 62/084,729, filed on Nov. 26, 2014.

(51) Int. Cl.
| | | |
|---|---|---|
| *G03F 1/22* | (2012.01) | |
| *G03F 1/80* | (2012.01) | |
| *G03F 1/64* | (2012.01) | |
| *G03F 1/62* | (2012.01) | |

(52) U.S. Cl.
CPC ..................................... *G03F 1/62* (2013.01)

(58) Field of Classification Search
CPC .......... H01L 24/94; H01L 24/78; H01L 24/83
See application file for complete search history.

(56) References Cited

U.S. PATENT DOCUMENTS

| | | |
|---|---|---|
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |

(Continued)

FOREIGN PATENT DOCUMENTS

| | | |
|---|---|---|
| JP | 2009-116284 | 5/2009 |
| KR | 10-2006-0120403 | 11/2006 |

(Continued)

OTHER PUBLICATIONS

Korean Application No. 10-2015-0143024, Notice of Allowance dated Jan. 3, 2017, 6 pgs.

(Continued)

*Primary Examiner* — Seahvosh Nikmanesh
(74) *Attorney, Agent, or Firm* — Haynes and Boone, LLP

(57) ABSTRACT

The present disclosure provides a method in accordance with some embodiments. A wafer is grinded from a back side. The wafer is inserted into an opening defined by a frame holder. The frame holder is attached to a carrier through a temporary layer. A front side of the wafer is attached to the temporary layer. Thereafter, the wafer is etched from the back side until the wafer reaches a predetermined thickness. Thereafter, the frame holder and the wafer therein are separated from the temporary layer and the carrier.

20 Claims, 15 Drawing Sheets

(56) References Cited

U.S. PATENT DOCUMENTS

| | | | |
|---|---|---|---|
| 8,753,788 B1 | 6/2014 | Yu et al. | |
| 8,764,995 B2 | 7/2014 | Chang et al. | |
| 8,765,330 B2 | 7/2014 | Shih et al. | |
| 8,765,582 B2 | 7/2014 | Hsu et al. | |
| 8,785,084 B2 | 7/2014 | Lu et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 8,912,075 B1* | 12/2014 | Lei | H01L 21/6836 257/620 |
| 2003/0218728 A1* | 11/2003 | del Puerto | B82Y 10/00 355/51 |
| 2004/0059444 A1* | 3/2004 | Tsukakoshi | G02B 7/023 700/59 |
| 2012/0045714 A1 | 2/2012 | Akiyama et al. | |
| 2013/0065160 A1 | 3/2013 | Lao | |
| 2013/0100428 A1 | 4/2013 | Ruoff et al. | |
| 2013/0136898 A1* | 5/2013 | Pratt | H01L 21/78 428/161 |
| 2014/0065521 A1 | 3/2014 | Lu et al. | |

FOREIGN PATENT DOCUMENTS

| | | |
|---|---|---|
| KR | 10-2012-0111997 | 10/2012 |
| KR | 10-2012-0121343 | 11/2012 |
| TW | 201024915 | 7/2010 |
| TW | 201516559 | 5/2015 |

OTHER PUBLICATIONS

Taiwanese Application No. 10521358740, Office Action dated Nov. 2, 2016, 4 pgs.

\* cited by examiner

PELLICLE FOR EUV MASK AND FABRICATION THEREOF

PRIORITY DATA

This application claims priority to Provisional Patent Application No. 62/084,729, filed Nov. 26, 2014, and entitled "Pellicle for EUV Mask and Fabrication Thereof," the disclosure of which is hereby incorporated by reference in its entirety.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask. Currently, binary intensity masks (BIM) are employed in EUVL for fabricating integrated circuits. EUVL is very similar to optical lithography in that it needs a mask to print wafers, except that it employs light in the EUV region, i.e., at 13.5 nm. At the wavelength of 13.5 nm or so, all materials are highly absorbing. Thus, reflective optics rather than refractive optics is used. A multi-layered (ML) structure is used as a EUV mask blank.

However, conventional EVU masks and the fabrication thereof may still have drawbacks. For example, the EVU mask has an absorber layer. Conventional EUV mask absorber layers may lead to large aerial image shifts, which are undesirable. As another example, EUV masks typically require a pellicle membrane, which serves as a protective cover to protect the EUV mask from damage and/or contaminant particles. However, the fabrication of the pellicle membrane according to certain conventional fabrication processes may cause the pellicle membrane to become distorted, broken, or otherwise damaged, thereby rendering the pellicle membrane unusable.

Therefore, while EUV lithography systems and processes have been generally adequate for their intended purposes, they have not been entirely satisfactory in every aspect. What is needed is a EUV lithography method system to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
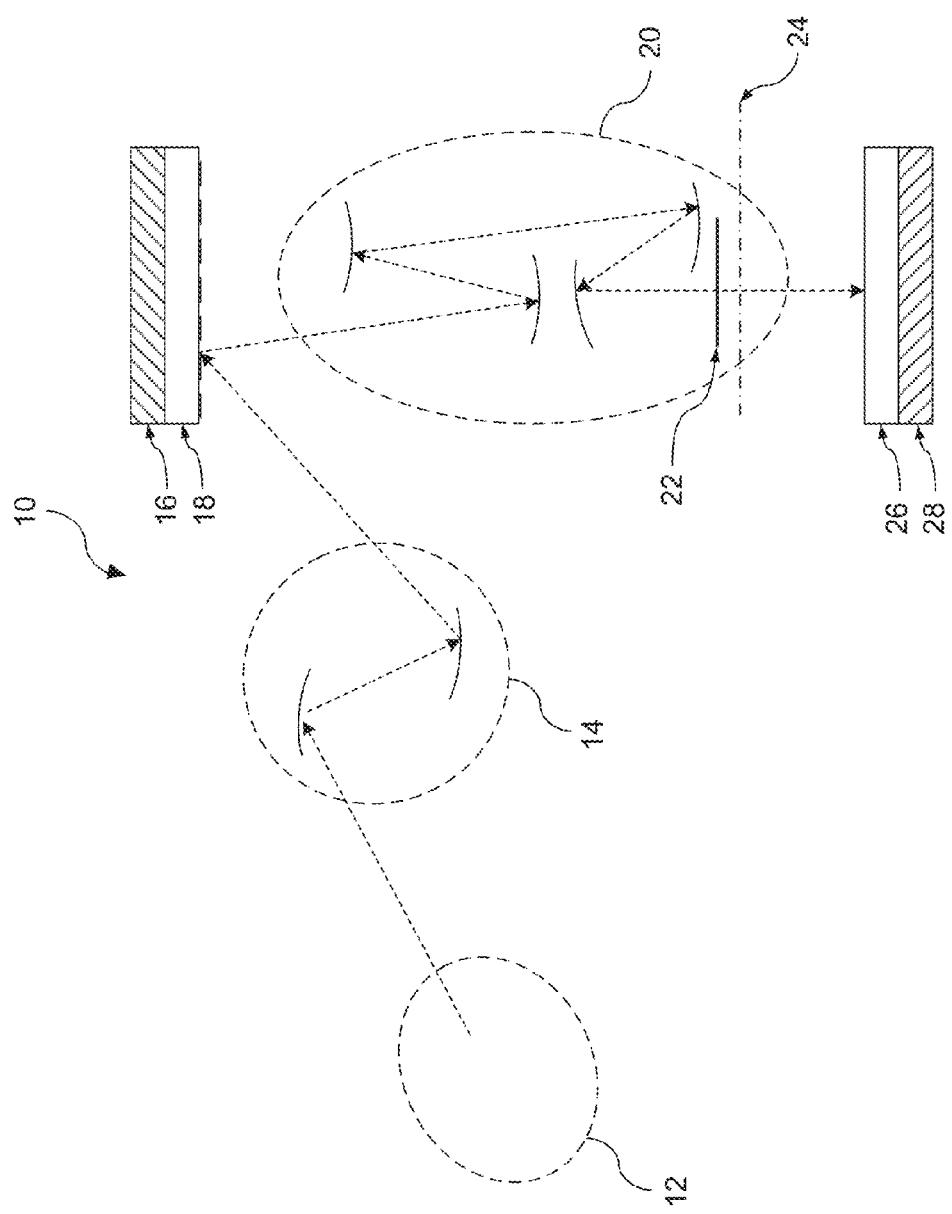
FIG. 1 is a schematic view of a lithography system constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view diagram of a lithography system 10, constructed in accordance with some embodiments. The lithography system 10 may also be generically referred to as a scanner that is operable to perform lithography exposing processes with respective radiation source and exposure mode. In the present embodiment, the lithography system 10 is an extreme ultraviolet (EUV) lithography system designed to expose a resist layer by EUV light. The resist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates an EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence $\sigma$ being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence $\sigma$ of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is an EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming an EUV phase shift mask.

The lithography system 10 also includes a projection optics module (or projection optics box (POB) 20 for imaging the pattern of the mask 18 on to a semiconductor substrate 26 secured on a substrate stage 28 of the lithography system 10. The POB 20 has refractive optics (such as for UV lithography system) or alternatively reflective optics (such as for EUV lithography system) in various embodiments. The light directed from the mask 18, carrying the image of the pattern defined on the mask, is collected by the POB 20. The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as a EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by depositing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
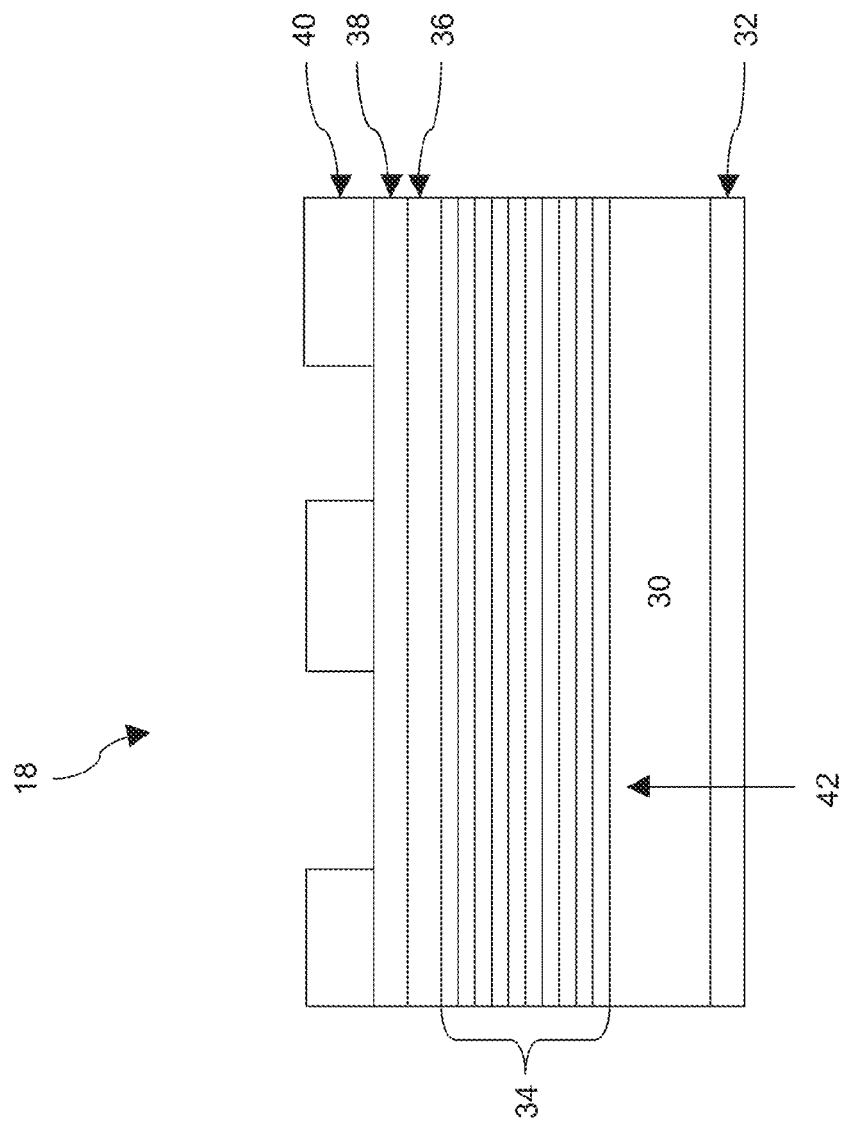
FIG. 2 is a sectional view of an EUV mask constructed in accordance with some embodiments.

One example of the mask 18 is shown in FIG. 2. The mask 18 is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The EUV mask 18 includes a reflective multilayer (ML) 34 disposed over the LTEM substrate 30. The ML 34 may be selected such that it provides a high reflectivity to a selected radiation type/wavelength. The ML 34 includes a plurality of film pairs, such as Mo/Si film pairs (e.g., a layer of molybdenum above or below a layer of silicon in each film pair). Alternatively, the ML 34 may include Mo/Be film pairs, or any materials with refractive index difference being highly reflective at EUV wavelengths. The thickness of each layer of the ML 34 depends on the EUV wavelength and the incident angle. Particularly, the thickness of the ML 34 (and the thicknesses of the film pairs) is adjusted to achieve a maximum constructive interference of the EUV light diffracted at each interface and a minimum absorption of the EUV light by the ML 34.

The EUV mask 18 also includes a capping layer 36 disposed over the ML 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask. In conventional EUV masks, the absorber layer is typically made of tantalum boron nitride, tantalum boron oxide, or chromium. However, the use of these materials in conventional EUV masks may lead to problems. One problem relates to an undesirable aerial image shift during exposure in a dipole illumination scheme.

Figure 3:
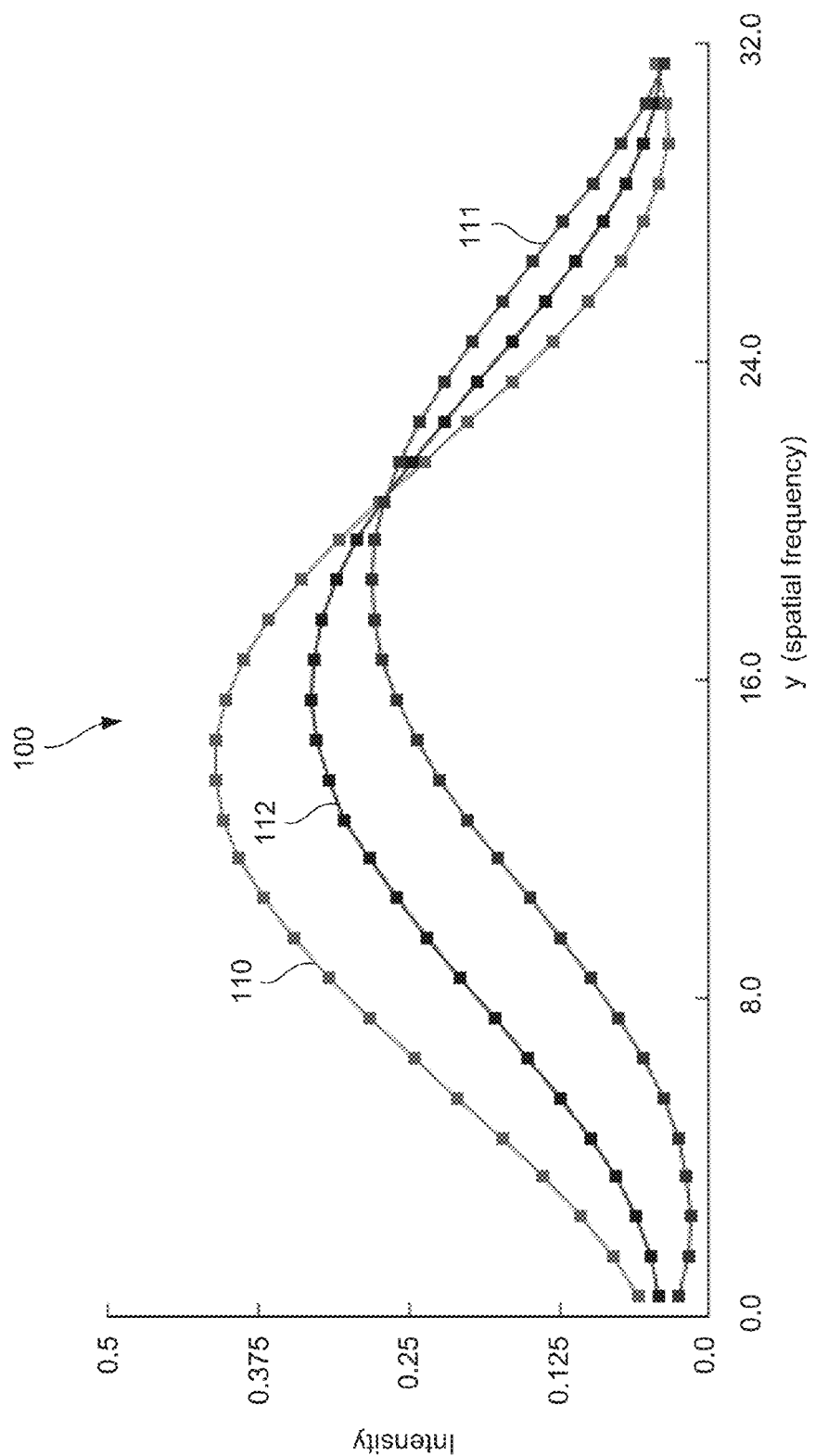
FIGS. 3-4 are graphs illustrating aerial image shift for different EUV masks.

For example, referring now to FIG. 3, a graph 100 illustrates plots 110-112 of light intensity versus spatial frequency (v) for an example conventional EUV mask. The conventional EUV mask has an absorber layer that is made of TaBo and/or TaBN. As discussed above, the illuminator 14 (shown in FIG. 1) includes dipole illumination optics. When conventional materials such as TaBo and/or TaBN are used to implement the absorber layer, the dipole illumination optics lead to a plot 110 (on the left side) and a plot 111 (on the right side) being generated. An average of these two plots 110-111 is the plot 112 (in the middle). As FIG. 3 visually indicates, the plot 110 and plot 111 have a relatively large offset from one another, and thus each plot 110/111 also has a relatively large offset from the average plot 112. This represents the relatively large aerial image shift associated with the example conventional EUV mask. Such aerial image shift during exposure is undesirable as it may lead to poor lithography performance.

According to the various embodiments of the present disclosure, the absorber layer of the EUV mask is configured to have a material that helps minimize the aerial image shift problem discussed above with reference to FIG. 3. In more detail, the absorber layer material of the EUV mask of the present disclosure has a refractive index and an extinction coefficient that are each tuned to a specific range. In some embodiments, the absorber layer material of the EUV mask of the present disclosure has a refractive index in a range from about 0.95 to about 1.01, and an extinction coefficient greater than about 0.03. In some further embodiments, the refractive index of the material of the absorber layer is in a range from 0.975 to 1. In yet further embodiments, the refractive index of the material of the absorber layer is in a range from 0.985 to 0.995. In some embodiments, the extinction coefficient of the material of the absorber layer is in a range from 0.4 to 0.54. In some further embodiments, the extinction coefficient of the material of the absorber layer is in a range from 0.45 to 0.5.

To meet the ranges of the refractive index and/or the extinction coefficient discussed above, the material of the absorber layer includes Radium according to some embodiments of the present disclosure. In some other embodiments, the material of the absorber layer includes a suitable oxide or nitride of one or more of the following materials: Actium, Radium, Tellurium, Zinc, Copper, and Aluminum. In yet other embodiments, the material of the absorber layer includes an alloy of one or more of the following materials: Actium, Radium, Tellurium, Zinc, Copper, and Aluminum.

The absorber layer with the specifically configured material (i.e., with the specific ranges of refractive index and extinction coefficient) allows the aerial image shift during exposure to be greatly reduced. This is visually illustrated in FIG. 4, which illustrates a graph 200 illustrates plots 210-212 of light intensity versus spatial frequency (v) for an example embodiment of an EUV mask according to the present disclosure. In other words, the absorber layer material of the EUV mask of the corresponding to the graph 200 has a specifically configured refractive index and/or extinction coefficient. For example, the absorber layer material of the EUV mask has a refractive index in a range from 0.975 to 1 and an extinction coefficient in a range from 0.4 to 0.54.

Figure 4:
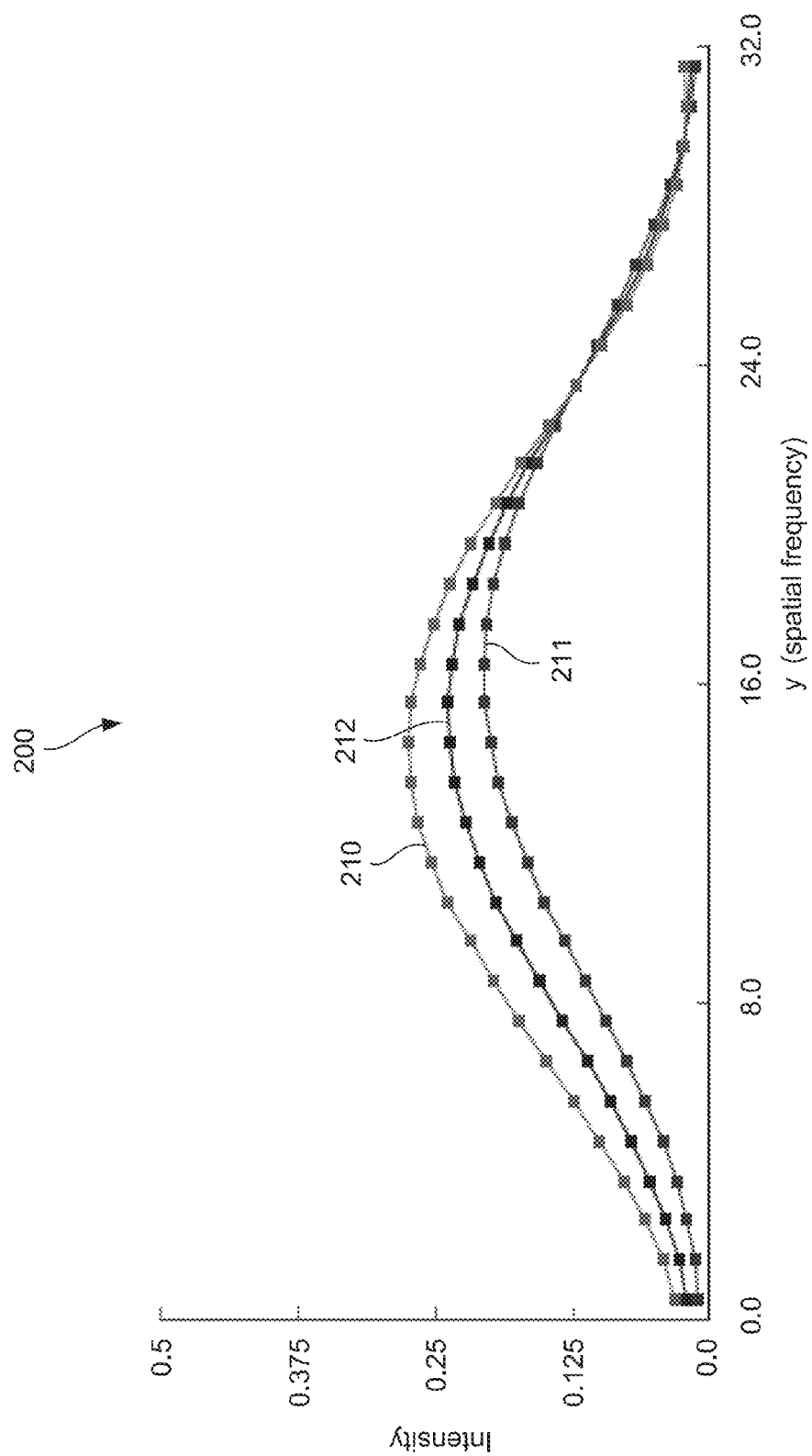

When such material is used to implement the absorber layer, the dipole illumination optics result in a plot 210 shown in FIG. 4 (on the left side) and a plot 211 (on the right side). An average of these two plots 210-211 is the plot 212 (in the middle). As FIG. 4 visually indicates, the plot 210 and plot 211 have a relatively small offset from one another, and thus each plot 210/211 also has a relatively small offset from the average plot 212. This represents the relatively small aerial image shift associated with the EUV mask of the present disclosure. A small aerial image shift is desirable as it leads to improved lithography performance.

Figure 5:
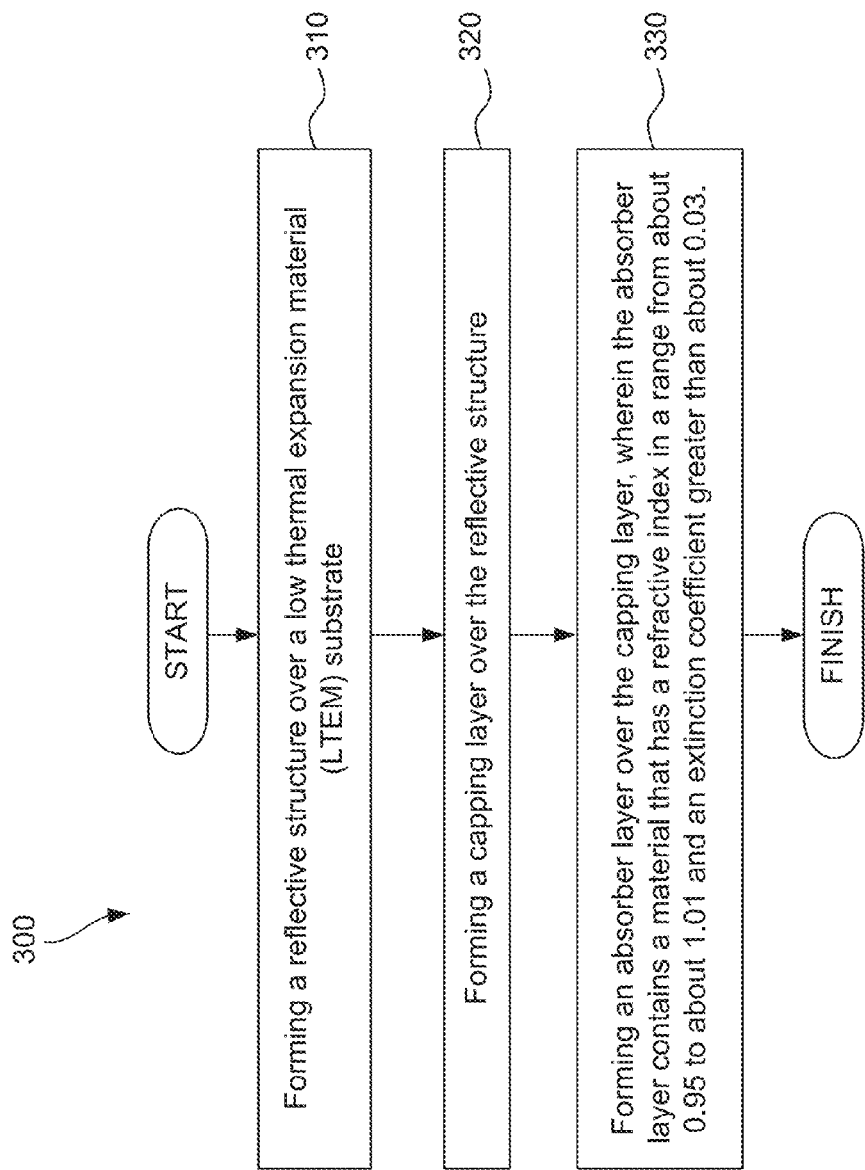
FIG. 5 is a flowchart of a method of fabricating an EUV mask in accordance with some embodiments.

FIG. 5 is a simplified flowchart illustrating a method 300 of fabricating a lithography mask according to an embodiment of the present disclosure. In some embodiments, the lithography mask is an EUV mask. The method 300 includes a step 310 of forming a reflective structure over a low thermal expansion material (LTEM) substrate. In some embodiments, the LTEM substrate contains $TiO_2$ doped $SiO_2$. The reflective structure is configured to provide high reflectivity to a predefined radiation wavelength, for example a wavelength in the EUV range. In some embodiments, the reflective structure includes a plurality of Mo/Si film pairs or a plurality of Mo/Be film pairs.

The method 300 includes a step 320 of forming a capping layer over the reflective structure. In some embodiments, the capping layer contains silicon.

The method 300 includes a step 330 of forming an absorber layer over the capping layer. The absorber layer contains a material that has a refractive index in a range from about 0.95 to about 1.01 and an extinction coefficient greater than about 0.03. The material of the absorber layer is specifically configured to reduce an aerial image shift of the EUV mask. In some embodiments, the refractive index of the material of the absorber layer is in a range from 0.975 to 1. In some further embodiments, the refractive index of the material of the absorber layer is in a range from 0.985 to 0.995. In some embodiments, the extinction coefficient of the absorber layer is in a range from 0.4 to 0.54. In some embodiments, the material of the absorber layer includes Radium.

It is understood that additional steps may be performed before, during, or after the steps 310-330 shown herein. For example, the method 300 may include a step of forming a buffer layer between the capping layer and the absorber layer. The buffer layer and the absorber layer have different etching characteristics. Additional steps are not specifically discussed herein for reasons of simplicity.

Another aspect of the present disclosure relates to method and apparatus of forming a pellicle for the EUV mask. A pellicle includes a thin membrane that is placed above the EUV mask, and it protects the EUV mask from contaminant particles or other things that could damage the mask. During lithography processes, the EUV mask (and thus the pellicle) may experience various kinds of movement that could tear or break the pellicle, since it is a thin membrane. In order to prevent or minimize the damage to the pellicle, certain EUV mask implementations the pellicle is supported by with a mesh structure (e.g., similar to a bee hive) to increase the overall structural integrity of the pellicle. Unfortunately, the mesh structure blocks EUV light, which leads to pattern non-uniformity issues.

According to the various aspects of the present disclosure, instead of using a mesh structure, a pellicle is bonded to a temporary bonding layer in order to prevent or minimize damage to the pellicle. In addition, the pellicle is implemented with a material with enhanced strength to further decrease the likelihood of damage to the pellicle, as discussed in greater detail below with reference to FIGS. 6-15.

Figure 6:
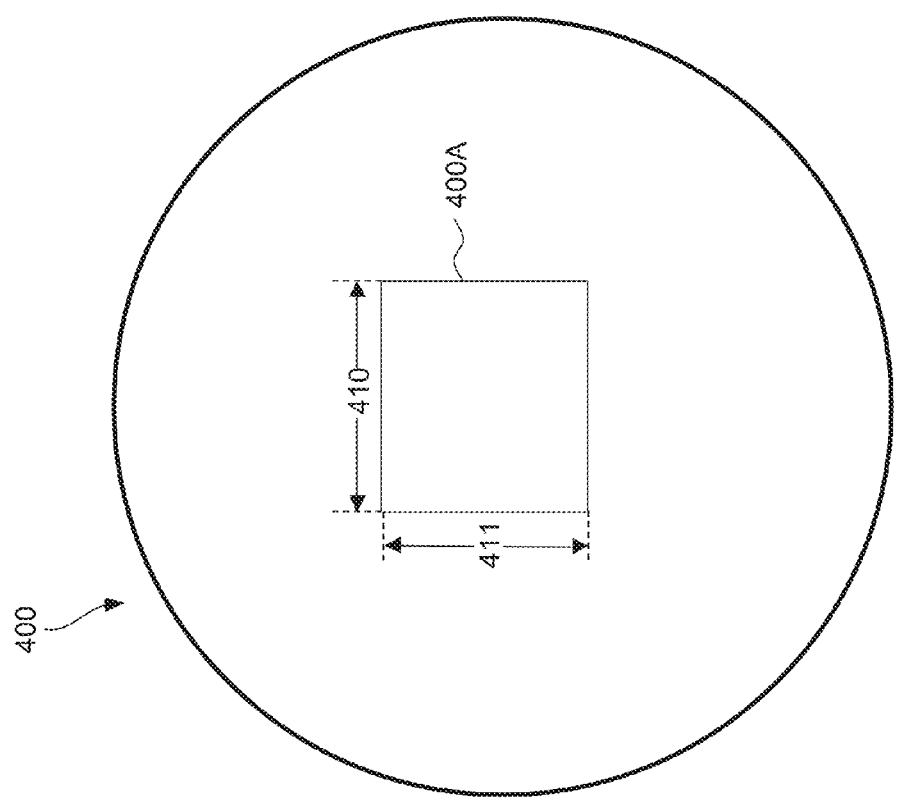
FIG. 6 is a simplified top view of a wafer in accordance with some embodiments.

Referring now to FIG. 6, a simplified top view of a wafer 400 is provided. In some embodiments, the wafer 400 is an epi-layer-on-insulator wafer, which will be discussed in more detail below with reference to FIG. 7. A dicing or singulation process is performed to the wafer 400 to separate the wafer 400 into a plurality of pieces. At least one of the pieces 400A is diced such that it has a dimension 410 measured in one horizontal or lateral direction and a dimension 411 measured in another horizontal or lateral direction. The two different horizontal/lateral dimensions may be perpendicular to one another in some embodiments. The dimensions 410-411 are configured such that they match the horizontal or lateral dimensions of an opening of a frame holder for the pellicle, as discussed below with reference to FIG. 9.

Figure 7:
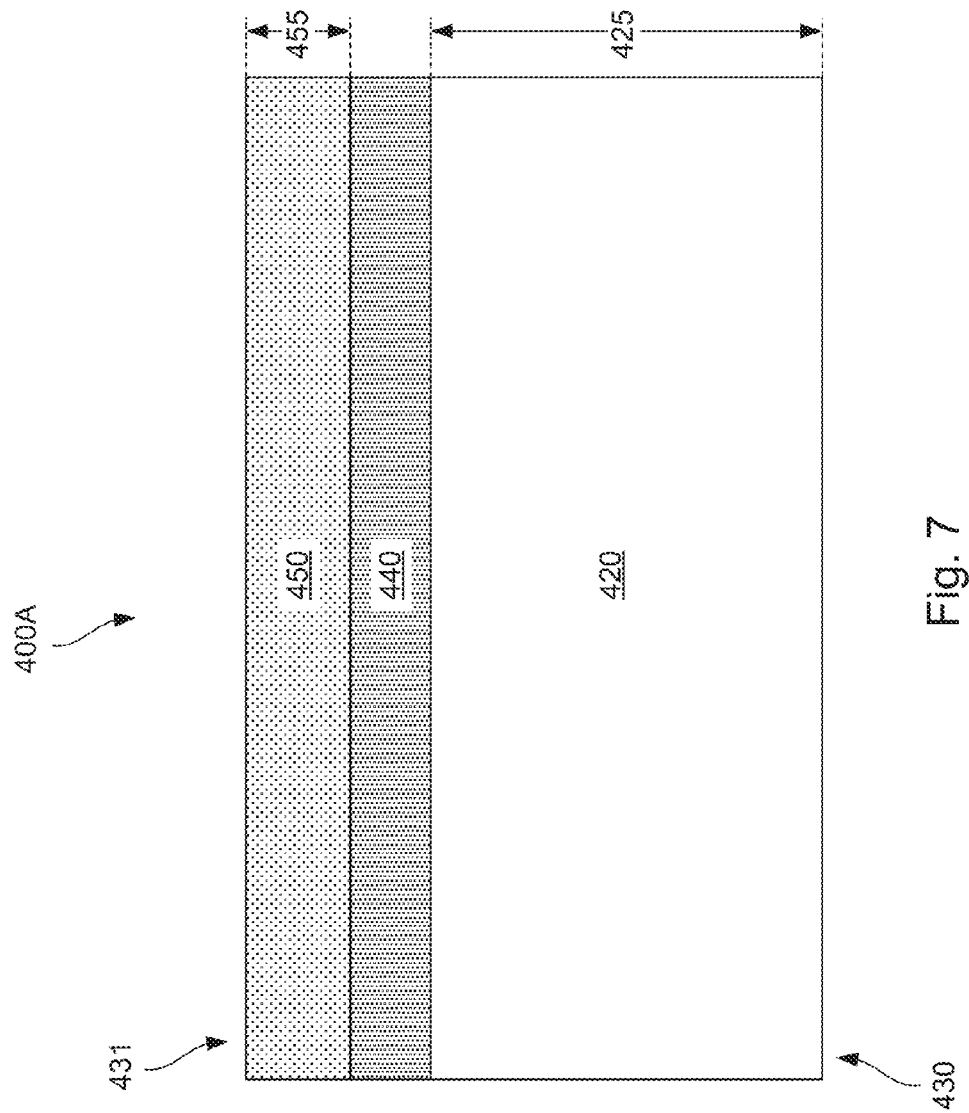
FIGS. 7-14 are simplified cross-sectional side views of various devices illustrating the fabrication of an EUV mask pellicle in accordance with some embodiments.

Referring now to FIG. 7, a simplified cross-sectional view of the portion of the wafer 400A (hereinafter referred to as the wafer 400A for the sake of simplicity) is illustrated. The wafer 400A includes a substrate 420. In some embodiments, the substrate 420 includes a semiconductor material, for example silicon. In other embodiments, the substrate 420 may include an insulator material or a conductor material. The substrate 420 has an initial thickness 425. In some embodiments, the thickness 425 is in a range from about 725 um to about 300 um.

The substrate 420 has a back side 430 and a front side 431 that is opposite the back side 430. An electrically-insulating layer 440 is disposed over the front side 431 of the substrate 420. In some embodiments, the electrically-insulating layer 440 includes a dielectric material, for example silicon oxide, silicon nitride, silicon oxynitride, etc. A layer 450 is disposed over the electrically-insulating layer 440. In other words, the electrically-insulating layer 440 is disposed in between the substrate 420 and the layer 450. The layer 450 has a thickness 455. In some embodiments, the thickness 455 is in a range from about 10 nanometers (nm) to about 100 nm. In some embodiments, the layer 450 includes an epitaxially-grown material, such as silicon carbide. In other embodiments, the layer 450 includes single crystal silicon (with different directions). In some other embodiments, the layer 450 includes graphene. These materials are chosen for their enhanced strength, as the layer 450 will become the pellicle for the EUV mask according to the fabrication flow of the present disclosure. The various candidate materials for the layer 450 are listed below in Table 1.

TABLE 1

| Material | Strength measured by GPa (Gigapascal) |
|---|---|
| Polycrystalline Yttrium iron garnet (YIG) | 193 |
| Single-crystal Yttrium iron garnet (YIG) | 200 |
| Aromatic peptide nanospheres | 230-275 |
| Beryllium (Be) | 287 |
| Molybdenum (Mo) | 329 |
| Tungsten (W) | 400-410 |
| Sapphire ($Al_2O_3$) along C-axis | 435 |
| Silicon carbide (SiC) | 450 |
| Osmium (Os) | 550 |
| Tungsten carbide (WC) | 450-650 |
| Single-walled carbon nanotube | 1,000 |
| Graphene | 1000 |
| Diamond (C)[27] | 1220 |
| Material | GPa |
| Aramid | 70.5-112.4 |
| Mother-of-pearl (nacre, largely calcium carbonate) | 70 |
| Tooth enamel (largely calcium phosphate) | 83 |
| Brass | 100-125 |
| Bronze | 96-120 |
| Titanium (Ti) | 110.3 |
| Titanium alloys | 105-120 |
| Copper (Cu) | 117 |
| Glass-reinforced plastic (70/30 by weight fibre/matrix, unidirectional, along grain) | 40-45 |
| Glass-reinforced polyester matrix | 17.2 |
| Carbon fiber reinforced plastic (50/50 fibre/matrix, biaxial fabric) | 30-50 |
| Carbon fiber reinforced plastic (70/30 fibre/matrix, unidirectional, along grain) | 181 |
| Silicon Single crystal, different directions | 130-185 |
| Wrought iron | 190-210 |
| Steel | 200 |

Figure 8:
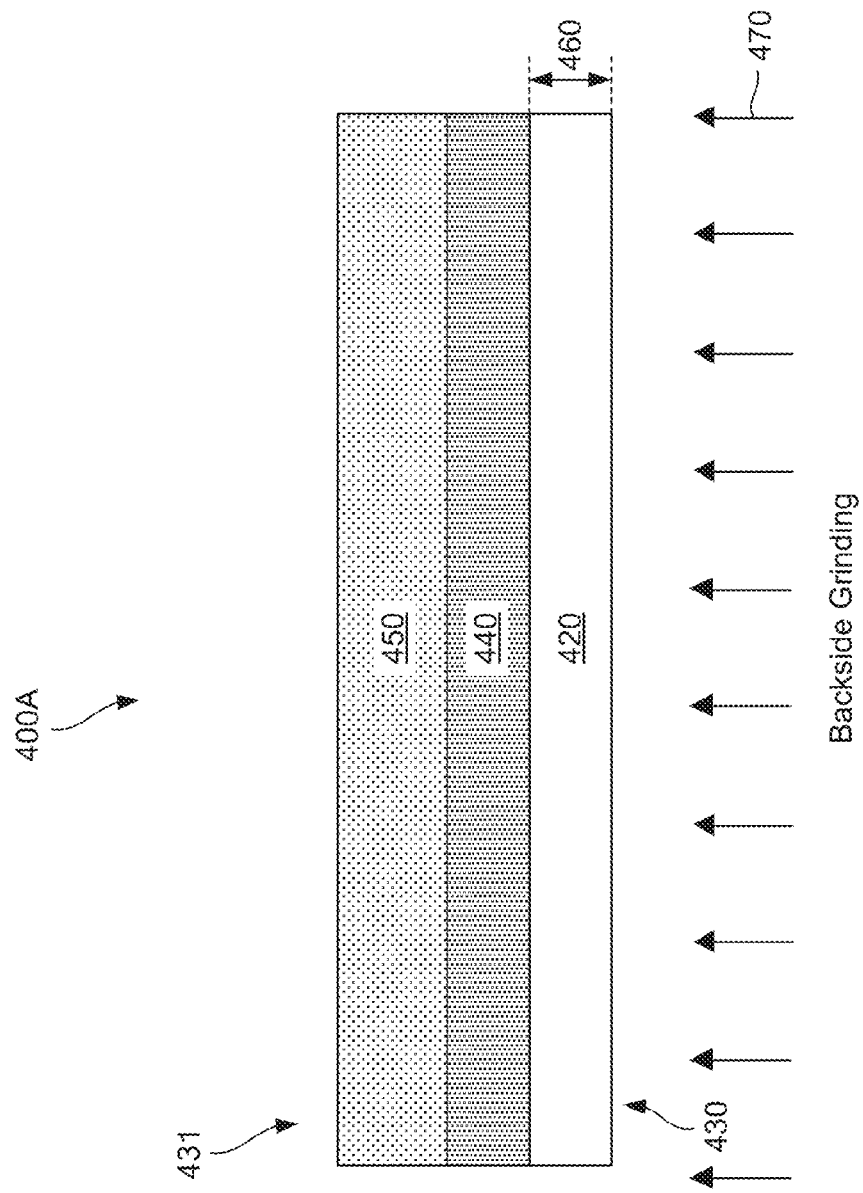

Referring now to FIG. 8, a grinding process 470 is performed on the back side 430 of the wafer 400A. The grinding process 470 reduces the substrate to a new thickness 460, which is in a range from about 10 nanometers (nm) to about 100 nm in some embodiments.

Figure 9:
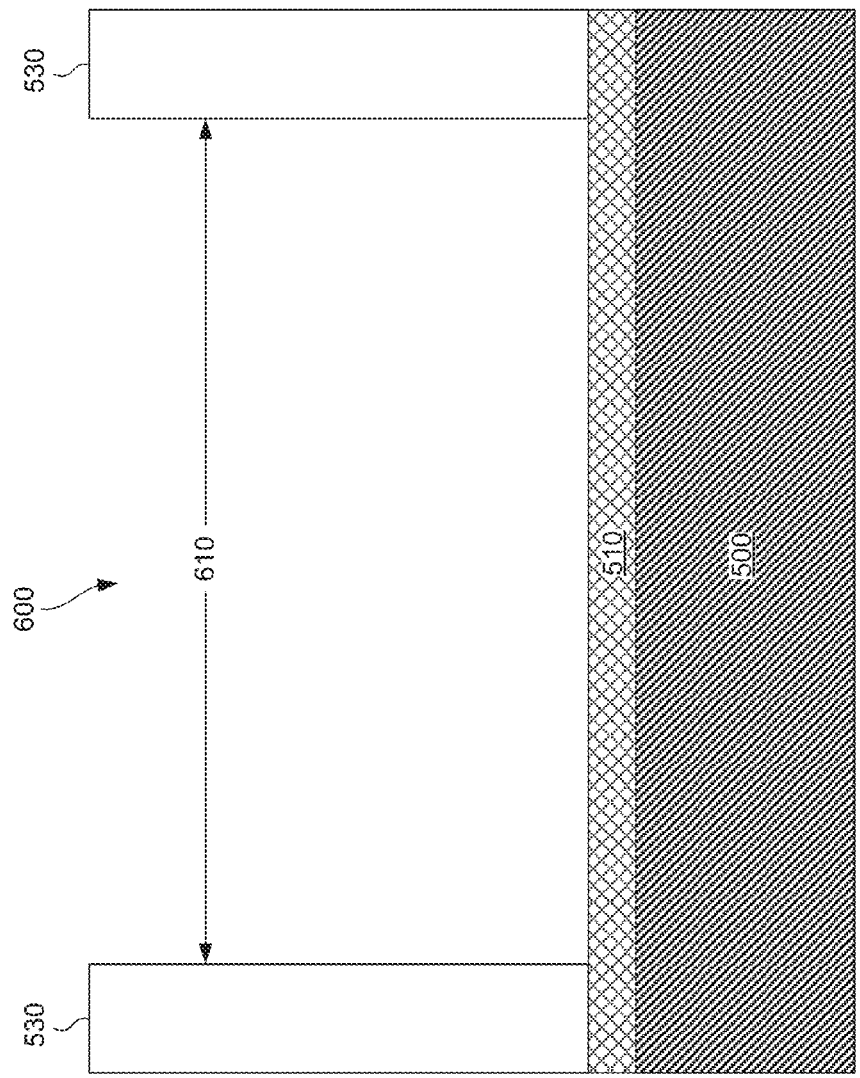

Referring now to FIG. 9, a simplified cross-sectional side view is illustrated for a carrier 500, a temporary bonding layer 510, and a frame holder 530. In some embodiments, the carrier 500 includes a carrier capable of providing mechanical strength and support, such as a ceramic substrate, a metal substrate, a bulk silicon substrate, etc. The temporary bonding layer 510 is attached to the carrier 500, and the frame holder 530 is attached to the temporary bonding layer 510 (or stated differently, attached to the carrier 500 through the temporary bonding layer 510). The temporary bonding layer 510 has adhesive properties that allow it to be attached to another layer, such as the frame holder 530 and the carrier 500. In addition, the temporary bonding layer 510 has foaming properties when treated by a suitable process, for example a heating process or an ultraviolet curing process.

Figure 10:
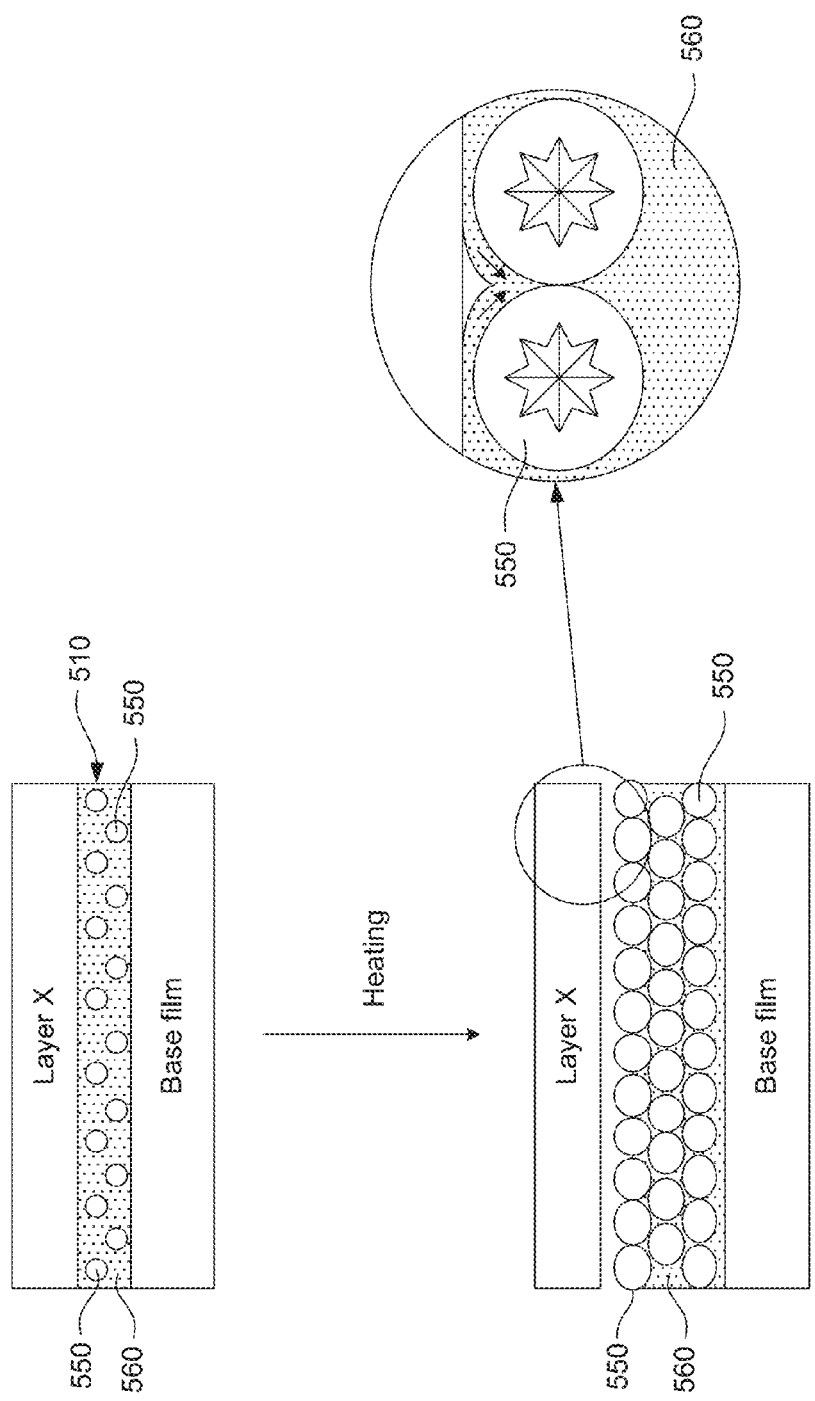

For example, referring now to FIG. 10, a more detailed cross-sectional view of the temporary layer 510 is illustrated according to an example context. The temporary bonding layer 510 is disposed on a base film on one side and is bonded to a layer X on the other side. The temporary bonding layer 510 contains foaming particles 550 (or material that has forming properties when treated) as well as adhesive material 560. The adhesive material 560 (e.g., glue-like material) allows the temporary bonding layer 510 to be adhered or bonded to the layer X. However, when the temporary bonding layer 510 is subjected to a treatment process such as a heating process or an UV curing process, the foaming particles 550 expand in size or volume. The expansion of the foaming particles reduces the contact area between the layer 510 and the layer X, thereby causing the layer X to lose its bonding or adhesion with the layer 510. In this manner, the layer X can be easily separated from the temporary bonding layer 510. This property of the temporary bonding layer 510 is utilized to facilitate the fabrication process of the present disclosure, as discussed below in more detail with reference to FIG. 13.

Referring back to FIG. 9, the frame holder 530 defines an opening 600. The opening 600 has a horizontal or lateral dimension 610 that matches (i.e., equal to) the horizontal/lateral dimension 410 of the wafer 400A (shown in FIG. 6). Had a different cross-sectional side view of the frame holder 530 been shown (i.e., a cross-sectional view perpendicular to the one shown in FIG. 9), the opening 600 would have been shown with a horizontal/lateral dimension that matches the horizontal/lateral dimension 411 of the wafer 400A. In other words, a top view geometry or shape of the wafer 400A matches (e.g., substantially identical) that of the opening 600.

Figure 11:
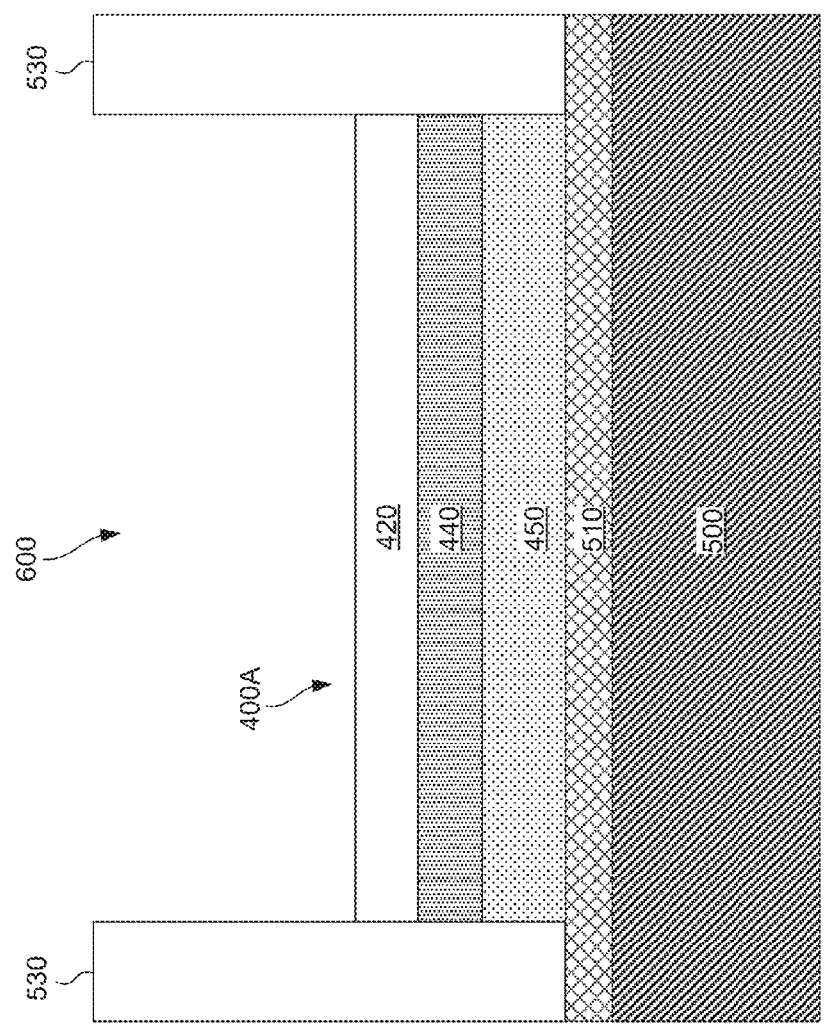

Referring now to FIG. 11, the wafer 400A is flipped vertically (i.e., flipped upside-down) and then inserted into the opening 600. The opening 600 accommodates the wafer 400A since the opening 600 and the wafer 400A have substantially identical geometries in the top view. According to some embodiments, the wafer 400A also fits snugly inside the opening 600, such that any space between the sidewalls of the frame holder 530 and the edges of the wafer 400A is negligible.

As shown in FIG. 11, after the insertion into the opening 600, the substrate 420 becomes the exposed surface (exposed by the opening 600), while the layer 450 is in direct contact with the temporary bonding layer 510. Since the temporary bonding layer 510 has adhesive properties, as discussed above, the layer 450 is attached or bonded to the temporary bonding layer 510 accordingly. The attachment of the layer 450 (and as such the wafer 400A) to the temporary bonding layer 510 (and as such to the carrier 500) helps prevent or minimize damage to the layer 450. In more detail, various processes such as chamber venting or manual handling may involve movement (e.g., vertical movement) of the layer 450. Such movement may cause the layer 450 to tear, peel, scratch, or break, particularly since the layer 450 is thin (e.g., 10-100 nm). Here, since the layer 450 is bonded to the carrier 500 through the temporary bonding layer 510, the movement of the layer 450 is tied to the carrier 500, and therefore the layer 450 is less likely to tear, peel, scratch, or break during the processes that involve movement of the layer 450. In addition, the enhanced strength of the layer 450 due to its specific material composition (e.g., silicon carbide) also reduces the likelihood of damage to the layer 450.

Figure 12:
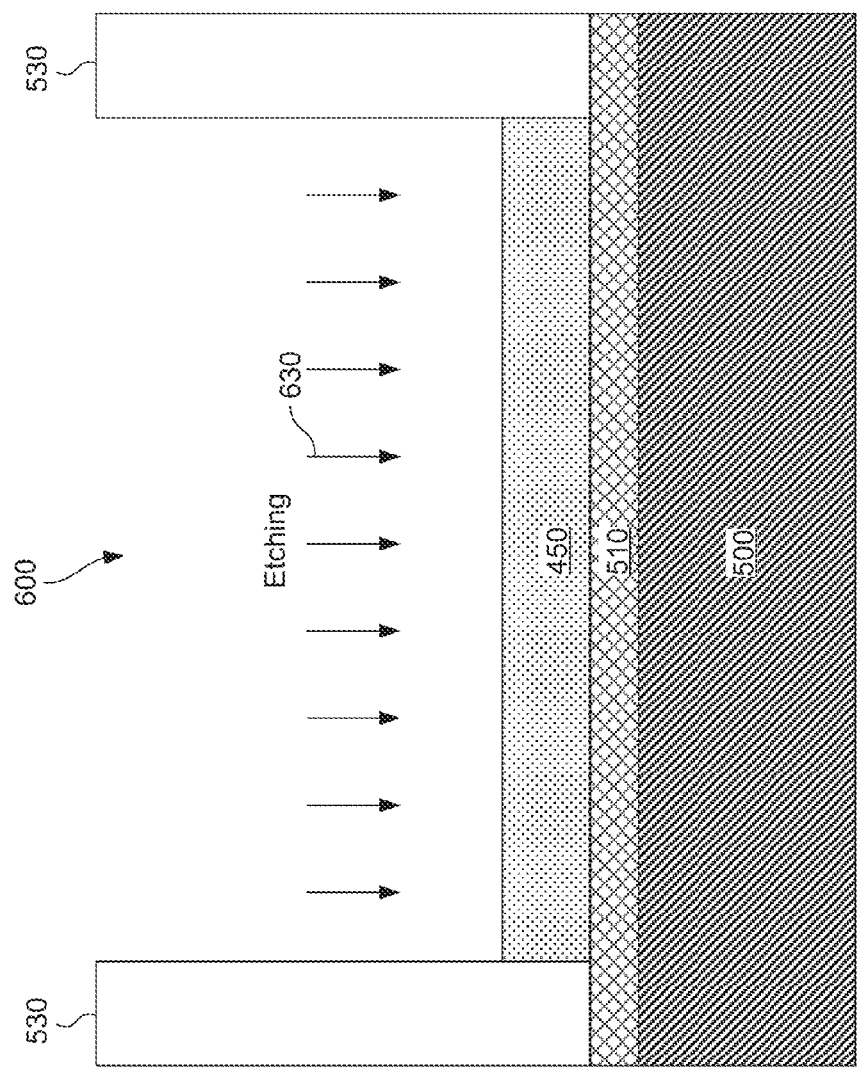

Referring now to FIG. 12, one or more etching processes 630 are performed to etch away the substrate 420 and the electrically-insulating layer 440. The layer 450 remains in the opening 600 at the end of the etching process 630. At this stage of the fabrication, the wafer 400A has been reduced to a thickness of about 10-100 nm, which is the thickness of the layer 450. In some embodiments when the layer 450 is formed too thick initially, the layer 450 may be etched additionally to further reduce the thickness thereof.

Figure 13:
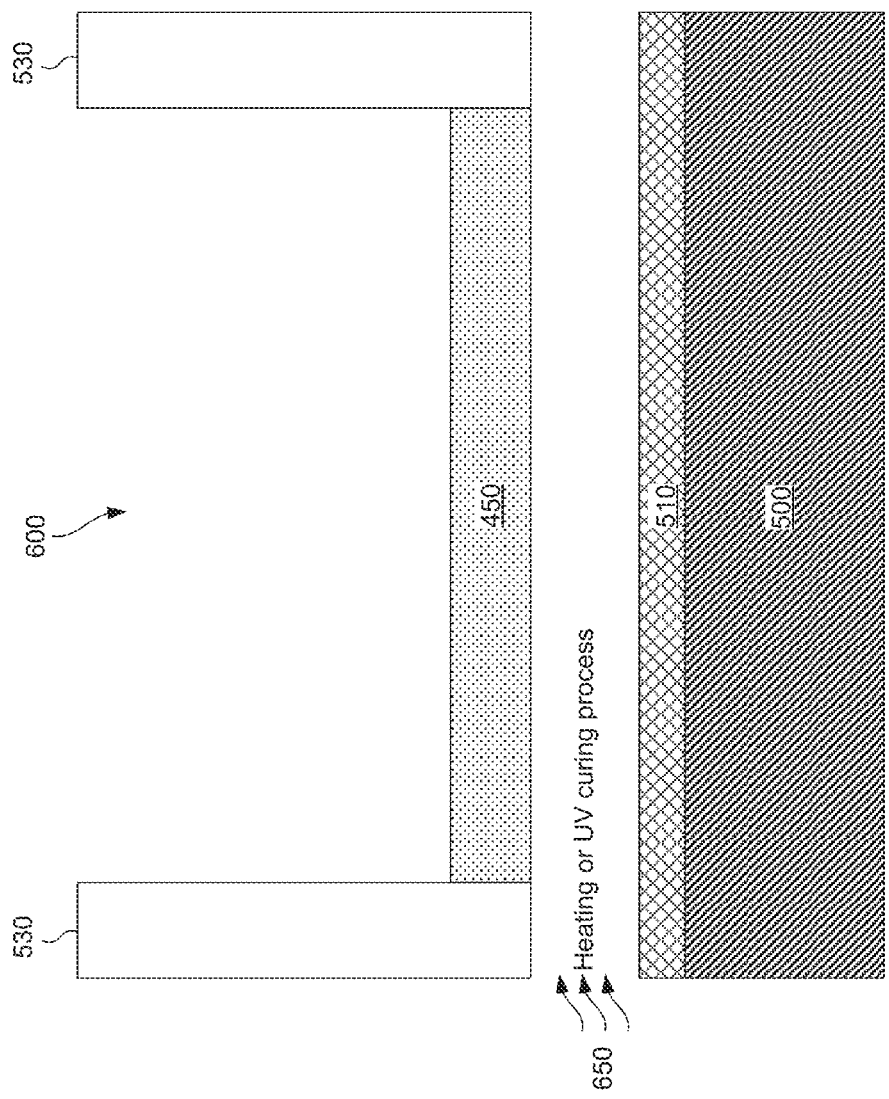

Referring now to FIG. 13, a heating or ultraviolet (UV) curing process 650 is performed to separate the frame holder 530 and the layer 450 from the temporary bonding layer 510. As discussed above, under application of heat or UV radiation, the foaming material in the temporary bonding layer 510 expands, thereby causing the temporary bonding layer 510 to lose its attachment with the frame holder 530 and the layer 450. In this manner, the temporary bonding layer 510 and the carrier 500 are separated from the frame holder 530 and the layer 450 disposed therein.

Figure 14:
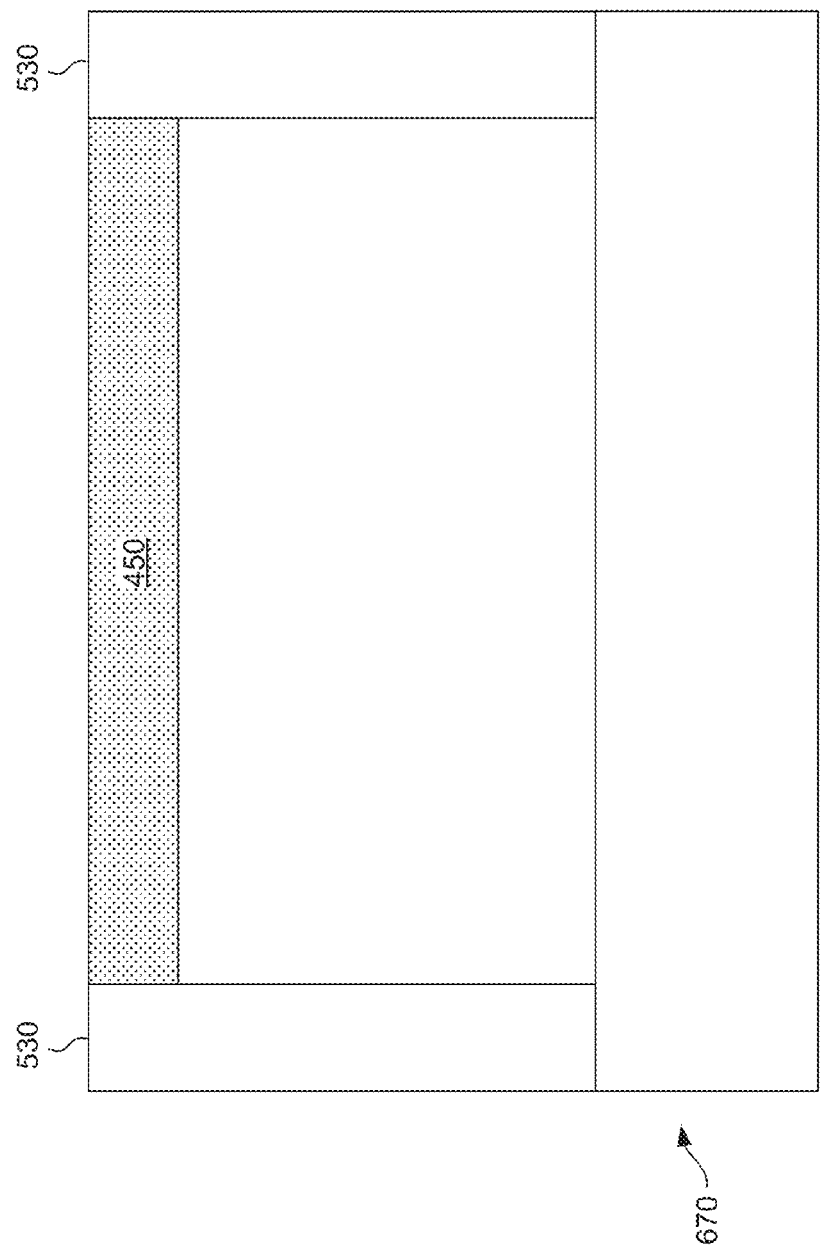

Referring now to FIG. 14, the frame holder 530 and the layer 450 disposed therein are collectively flipped vertically (i.e., upside down) and then placed or positioned over an EUV mask 670. In some embodiments, the EUV mask 670 is a conventional EUV mask. In other embodiments, the EUV mask 670 is the EUV mask 18 discussed above with the specifically configured absorber layer. At this stage of fabrication, the layer 450 serves as the pellicle membrane for the EUV mask 670. In other words, the layer 450 protects the EUV mask 670 from contaminant particles or other objects that could potentially damage the EUV mask or otherwise interfere with the EUV lithography.

Figure 15:
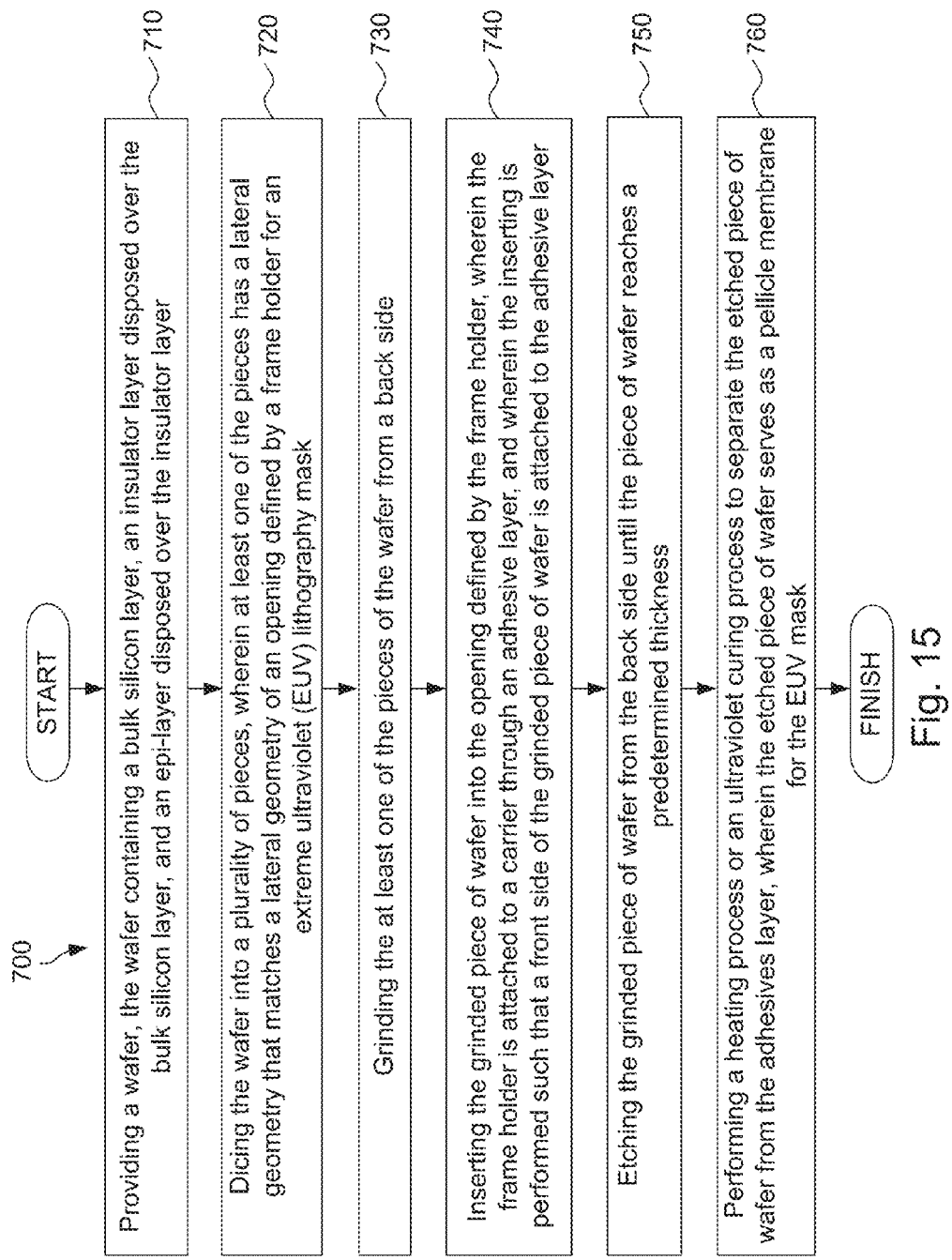
FIG. 15 is a flowchart of a method of forming an EUV mask pellicle in accordance with some embodiments.

FIG. 15 is a flowchart illustrating a simplified method 700 of fabricating a pellicle for an EUV mask. The method 700 includes a step 710 of providing a wafer. The wafer contains a substrate, an insulator layer disposed over the substrate, and an epi-layer disposed over the insulator layer. In some embodiments, the epi-layer contains silicon carbide. In other embodiments, the epi-layer may include graphene or single crystal silicon.

The method 700 includes a step 720 of dicing the wafer into a plurality of pieces. At least one of the pieces has a lateral geometry that matches a lateral geometry of an opening defined by a frame holder for an extreme ultraviolet (EUV) lithography mask.

The method 700 includes a step 730 of grinding the at least one of the pieces of the wafer from a back side.

The method 700 includes a step 740 of inserting the grinded piece of wafer into the opening defined by the frame holder. The frame holder is attached to a carrier through an adhesive layer. The inserting is performed such that a front side of the grinded piece of wafer is attached to the adhesive layer. The adhesive layer contains foaming particles that expand when being treated with heat or ultraviolet radiation, thereby causing the adhesive layer to lose adhesion with the etched piece of wafer.

The method 700 includes a step 750 of etching the grinded piece of wafer from the back side until the piece of wafer reaches a predetermined thickness.

The method 700 includes a step 760 of performing a heating process or an ultraviolet curing process to separate the etched piece of wafer from the adhesives layer. The etched piece of wafer serves as a pellicle membrane for the EUV mask.

In some embodiments, the grinding (step 730) and the etching (step 750) are performed on the substrate and the insulator layer.

It is understood that additional fabrication processes may be performed before, during, or after the steps 710-760 of FIG. 15. For example, the method 700 may include an additional step of placing the pellicle membrane on an EUV mask. Other fabrication processes are not discussed in detail herein for reasons of simplicity.

Based on the above discussions, it can be seen that the present disclosure offers various advantages in EUV lithography. It is understood, however, that not all advantages are necessarily discussed herein, and other embodiments may offer different advantages, and that no particular advantage is required for all embodiments.

One of the advantages is that the absorber layer of the EUV mask has a material composition specifically configured to minimize an aerial image shift during exposure. As a result, EUV lithography performance is improved. Another advantage is that the pellicle membrane fabricated according to embodiments of the present disclosure has enhanced strength due to its material composition (e.g., silicon carbide), which reduces the likelihood of damage during various processes such as venting and handling processes. Yet another advantage is that the use of the temporary bonding layer to secure the pellicle membrane further reduces the likelihood of any peeling or breaking of the pellicle membrane. The temporary bonding layer is also easily removed via a treatment process such as heat or UV curing. The processes discussed herein are also simple and easy to perform and are compatible with existing process flow.

The present disclosure provides for a photolithography mask in accordance with some embodiments. The photolithography mask includes a substrate that contains a low thermal expansion material (LTEM). A reflective structure is disposed over the substrate. A capping layer is disposed over the reflective structure. An absorber layer is disposed over the capping layer. The absorber layer contains a material that has a refractive index in a range from about 0.95 to about 1.01 and an extinction coefficient greater than about 0.03.

The present disclosure provides for a photolithography system in accordance with some embodiments. The photolithography system includes a radiation source configured to generate extreme ultraviolet (EUV) radiation, an EUV mask and an illuminator. The EUV mask includes an absorber layer that contains a material that has a refractive index in a range from about 0.95 to about 1.01 and an extinction coefficient greater than about 0.03. The illuminator includes one or more refractive or reflective optical components. The illuminator is configured to direct the EUV radiation onto the EUV mask.

The present disclosure provides for a method of fabricating a photolithography mask in accordance with some embodiments. A reflective structure is formed over a low thermal expansion material (LTEM) substrate. A capping layer is formed over the reflective structure. An absorber layer is formed over the capping layer. The absorber layer contains a material that has a refractive index in a range from about 0.95 to about 1.01 and an extinction coefficient greater than about 0.03.

The present disclosure provides for a method in accordance with some embodiments. A wafer is grinded from a back side. The wafer is inserted into an opening defined by a frame holder. The frame holder is attached to a carrier through a temporary layer. The inserting is performed such that a front side of the wafer is attached to the temporary layer. The wafer is etched from the back side until the wafer reaches a predetermined thickness. Thereafter, the frame holder and the wafer therein are separated from the temporary layer and the carrier.

The present disclosure provides for a method in accordance with some embodiments. A portion of a wafer is grinded from a back side. Thereafter the portion of the wafer is inserted into an opening defined by a frame holder. The frame holder is attached to a carrier through a temporary bonding layer. A front side of the portion of the wafer is bonded to the temporary bonding layer. Thereafter, the portion of the wafer is etched from the back side until the portion of the wafer reaches a predetermined thickness that is in a range from about 10 nanometers to about 100 nanometers. Thereafter, a heating process or an ultraviolet curing process is performed to de-bond the temporary bonding layer from the portion of the wafer, thereby forming a pellicle with the de-bonded portion of the wafer.

The present disclosure provides for a method in accordance with some embodiments. A wafer is provided. The wafer contains a substrate, an insulator layer disposed over the substrate, and an epi-layer disposed over the insulator layer. The wafer is diced into a plurality of pieces. At least one of the pieces has a lateral geometry that matches a lateral geometry of an opening defined by a frame holder for an extreme ultraviolet (EUV) lithography mask. The at least one of the pieces of the wafer is grinded from a back side. Thereafter, the grinded piece of wafer is inserted into the opening defined by the frame holder. The frame holder is attached to a carrier through an adhesive layer. A front side of the grinded piece of wafer is attached to the adhesive layer. Thereafter, the grinded piece of wafer is etched from the back side until the piece of wafer reaches a predetermined thickness. Thereafter, a heating process or an ultraviolet curing process is performed to separate the etched piece of wafer from the adhesives layer. the etched piece of wafer serves as a pellicle membrane for the EUV mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
grinding a portion of a wafer from a back side;
after the grinding, inserting the portion of the wafer into an opening defined by a frame holder, wherein the frame holder is attached to a carrier through a tempo- rary layer, wherein the inserting is performed such that a front side of the portion of the wafer is attached to the temporary layer;

thereafter etching the portion of the wafer from the back side until the portion of the wafer reaches a predetermined thickness; and thereafter separating the frame holder and the portion of the wafer therein from the temporary layer and the carrier.

2. The method of claim 1, wherein the portion of the wafer in the frame holder, after being separated from the temporary layer and the carrier, serves as a pellicle for an extreme ultraviolet (EUV) lithography process, wherein the pellicle is configured to be placed over an EUV mask.

3. The method of claim 1, wherein the front side of the portion of the wafer is attached to the temporary layer through adhesion, and wherein the temporary layer contains a foaming material that expands under application of heat or ultraviolet radiation.

4. The method of claim 3, wherein the separating comprises applying heat or ultraviolet radiation to the temporary layer to cause the foaming material to expand, thereby losing the adhesion with the front side of the portion of the wafer.

5. The method of claim 1, further comprising, before the grinding of the wafer:
providing a wafer; and
dicing the wafer into a plurality of pieces, wherein one piece of the wafer is the portion of the wafer on which the grinding, the inserting, the etching, and the separating is performed.

6. The method of claim 5, wherein the dicing the wafer is performed such that the one piece of the wafer has a horizontal geometry that matches a horizontal geometry of the opening defined by the frame holder.

7. The method of claim 1, wherein:
the portion of the wafer contains a substrate, an insulator layer disposed over the substrate, and a material layer disposed over the insulator layer; and
the grinding and the etching are performed on the substrate and the insulator layer.

8. The method of claim 7, wherein the material layer contains silicon carbide, graphene, or silicon single crystal.

9. The method of claim 1, wherein the predetermined thickness is in a range from about 10 nanometers to about 100 nanometers.

10. A method, comprising:
grinding a singulated piece of a wafer from a back side;
after the grinding, inserting the singulated piece of the wafer into an opening defined by a frame holder, wherein the frame holder is attached to a carrier through a temporary layer, wherein the inserting is performed such that a front side of the singulated piece of the wafer is attached to the temporary layer;
thereafter etching the singulated piece of the wafer from the back side until the singulated piece of the wafer reaches a predetermined thickness; and
thereafter separating the frame holder and the singulated piece of the wafer therein from the temporary layer and the carrier, wherein the separating comprises performing a heating process or performing an ultraviolet radiation process.

11. The method of claim 10, wherein the singulated piece of the wafer in the frame holder, after being separated from the temporary layer and the carrier, serves as a pellicle for an extreme ultraviolet (EUV) lithography process, wherein the pellicle is configured to be placed over an EUV mask.

12. The method of claim 10, wherein the front side of the singulated piece of the wafer is attached to the temporary layer through adhesion, and wherein the temporary layer contains a foaming material that expands in response to the heating process or the ultraviolet radiation process being performed, and wherein an expansion of the foaming material causes the wafer to lose the adhesion to the temporary layer.

13. The method of claim 10, further comprising, before the grinding of the singulated piece of the wafer:
providing a wafer; and
dicing the wafer into a plurality of pieces, wherein one piece of the wafer is the singulated piece of the wafer on which the grinding, the inserting, the etching, and the separating is performed.

14. The method of claim 13, wherein the dicing the wafer is performed such that the one piece of the wafer has a horizontal geometry that matches a horizontal geometry of the opening defined by the frame holder.

15. The method of claim 10, wherein:
the singulated piece of the wafer contains a substrate, an insulator layer disposed over the substrate, and a material layer disposed over the insulator layer; and
the grinding and the etching are performed on the substrate and the insulator layer.

16. The method of claim 15, wherein the material layer contains silicon carbide, graphene, or silicon single crystal.

17. The method of claim 10, wherein the predetermined thickness is in a range from about 10 nanometers to about 100 nanometers.

18. A method, comprising:
grinding a portion of a wafer from a back side;
after the grinding, inserting the portion of the wafer into an opening defined by a frame holder, wherein the frame holder is attached to a carrier through a temporary layer, wherein the inserting is performed such that a front side of the portion of the wafer is attached to the temporary layer through adhesion, and wherein the temporary layer contains a foaming material that expands under application of heat or ultraviolet radiation;
thereafter etching the portion of the wafer from the back side until the portion of the wafer reaches a predetermined thickness; and
thereafter separating the frame holder and the portion of the wafer therein from the temporary layer and the carrier, wherein the separating comprises applying heat or ultraviolet radiation to the temporary layer to cause the foaming material to expand, thereby losing the adhesion with the front side of the portion of the wafer.

19. The method of claim 18, further comprising:
before the grinding of the portion of the wafer: providing a wafer and dicing the wafer into a plurality of pieces, wherein one piece of the wafer is the portion of the wafer on which the grinding, the inserting, the etching, and the separating is performed; and
after the separating, using the portion of the wafer in the frame holder as a pellicle for an extreme ultraviolet (EUV) lithography process.

20. The method of claim 18, wherein:
the portion of the wafer contains a substrate, an insulator layer disposed over the substrate, and a material layer disposed over the insulator layer, the material layer containing:
silicon carbide, graphene, or silicon single crystal;
the grinding and the etching are performed on the substrate and the insulator layer; and the etching is performed until a thickness in a range from about 10 nanometers to about 100 nanometers is reached.

\* \* \* \* \*